(12) United States Patent
Lee et al.

(10) Patent No.: US 10,944,273 B2
(45) Date of Patent: Mar. 9, 2021

(54) APPARATUS AND METHOD FOR BALANCING BATTERY AND BATTERY PACK INCLUDING THE SAME

(71) Applicant: LG CHEM, LTD., Seoul (KR)

(72) Inventors: Hyun-Chul Lee, Daejeon (KR); Ju-Young Sun, Daejeon (KR); Seung-Min Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/738,163

(22) Filed: Jan. 9, 2020

(65) Prior Publication Data

US 2020/0235588 A1 Jul. 23, 2020

(30) Foreign Application Priority Data

Jan. 10, 2019 (KR) .................. 10-2019-0003392

(51) Int. Cl.
| | |
|---|---|
| *H02J 7/00* | (2006.01) |
| *G01R 31/36* | (2020.01) |
| *H01M 10/42* | (2006.01) |
| *H01M 10/48* | (2006.01) |
| *H01M 10/44* | (2006.01) |
| *B60L 58/22* | (2019.01) |

(52) U.S. Cl.
CPC ............ *H02J 7/0014* (2013.01); *G01R 31/36* (2013.01); *H01M 10/425* (2013.01); *H01M 10/441* (2013.01); *H01M 10/482* (2013.01); *H01M 2010/4271* (2013.01)

(58) Field of Classification Search
None
See application file for complete search history.

(56) References Cited

U.S. PATENT DOCUMENTS

| | | | |
|---|---|---|---|
| 2007/0025135 A1 | 2/2007 | Yamamoto et al. | |
| 2009/0096420 A1* | 4/2009 | Lupu | H02J 7/0016 320/122 |
| 2011/0057617 A1* | 3/2011 | Finberg | H02J 7/0021 320/118 |
| 2013/0099746 A1 | 4/2013 | Nork et al. | |

(Continued)

FOREIGN PATENT DOCUMENTS

| | | |
|---|---|---|
| JP | 2007-043788 A | 2/2007 |
| JP | 2008-193871 A | 8/2008 |

(Continued)

*Primary Examiner* — David V Henze-Gongola
(74) *Attorney, Agent, or Firm* — Morgan, Lewis & Bockius LLP (57) ABSTRACT

An apparatus for balancing a battery according to the present disclosure includes: a voltage measuring unit configured to measure a voltage of each of a plurality of battery cells connected to each other; and a control unit configured to calculate a state of charge (SOC) of each of the battery cells from the voltage measured by the voltage measuring unit, select a standard cell and a target group on the basis of the calculated SOCs of the battery cells, choose one battery cell among battery cells belonging to the selected target group as a target cell, calculate a balancing time according to a difference between the SOC of the standard cell and the SOC of the target cell, and perform balancing to the battery cells belonging to the target group during the calculated balancing time.

11 Claims, 5 Drawing Sheets

(56) References Cited

U.S. PATENT DOCUMENTS

| | | | |
|---|---|---|---|
| 2016/0276847 A1 | 9/2016 | Kang et al. | |
| 2016/0336623 A1* | 11/2016 | Nayar | H02J 7/0068 |
| 2019/0356140 A1 | 11/2019 | Sung | |
| 2020/0161880 A1* | 5/2020 | Rangelov | H02J 7/0022 |

FOREIGN PATENT DOCUMENTS

| | | | | |
|---|---|---|---|---|
| JP | 2009-081989 A | | 4/2009 | |
| JP | 2018-057129 A | | 4/2018 | |
| JP | 6379956 B2 | | 8/2018 | |
| KR | 20130020946 A | * | 3/2013 | ......... G01R 31/3835 |
| KR | 20130126085 A | * | 11/2013 | ............ H02J 7/0014 |
| KR | 20140061840 A | * | 5/2014 | ............ H02J 7/0014 |
| KR | 101491460 B1 | * | 2/2015 | ............ H02J 7/0014 |
| KR | 10-1619268 B1 | | 5/2016 | |
| KR | 10-1767561 B1 | | 8/2017 | |
| KR | 10-2018-0128817 A | | 12/2018 | |

* cited by examiner

APPARATUS AND METHOD FOR BALANCING BATTERY AND BATTERY PACK INCLUDING THE SAME

TECHNICAL FIELD

The present application claims priority to Korean Patent Application No. 10-2019-0003392 filed on Jan. 10, 2019 in the Republic of Korea, the disclosures of which are incorporated herein by reference.

The present disclosure relates to a battery balancing apparatus and method for balancing a plurality of battery cells included in a battery module within a minimum balancing time, and a battery pack including the same.

BACKGROUND ART

Generally, secondary batteries include nickel cadmium batteries, nickel hydrogen batteries, lithium ion batteries and lithium ion polymer batteries. The secondary batteries are applied not only to small products such as digital cameras, P-DVDs, MP3Ps, mobile phones, PDAs, portable game devices, power tools and e-bikes but also to large products demanding a high output such as electric vehicles or hybrid electric vehicles and power storage devices and backup power storage devices for generating surplus power or storing renewable energy.

Meanwhile, a large capacity battery used in an electric vehicle, a hybrid electric vehicle or a power storage device includes a plurality of unit cell assemblies connected in series and/or in parallel. In a battery in which a plurality of unit cells are connected, a variation is generated in charge capacity of each unit cell as charging and discharging are repeated. If charging or discharging is continued while leaving the variation in charging capacity, some unit cells may come into an overcharged state or an overdischarged state. The overcharged or overdischarged state may hinder the safety of the unit cell, and in some cases, may cause an unexpected accident such as an explosion.

In order to solve the above problems, a conventional battery cell balancing apparatus and method for balancing battery cells using a balancing time calculated from each of the battery cells has been disclosed (Patent Document 1).

According to Patent Document 1, since the balancing time should be calculated for each battery cell, there is a problem that a memory storing the balancing time is increased in proportion to the number of battery cells. That is, according to Patent Document 1, a complex control circuit is required to balance a plurality of battery cells. In addition, in Patent Document 1, the time required for balancing is unnecessarily increased because the balancing time should be calculated for each battery cell in the balancing process and the calculated balancing time should be stored.

(Patent Document 1) KR 10-1601717 B1

DISCLOSURE

Technical Problem

The present disclosure is designed to solve the problems of the related art, and therefore the present disclosure is directed to providing a battery balancing apparatus and method for reducing the waste of storage space required for balancing and preventing overcharge or overdischarge, and a battery pack including the same.

Technical Solution

In one aspect of the present disclosure, there is provided an apparatus for balancing a battery, comprising: a voltage measuring unit configured to measure a voltage of each of a plurality of battery cells connected to each other; and a control unit configured to calculate a state of charge (SOC) of each of the battery cells from the voltage measured by the voltage measuring unit, select a standard cell and a target group on the basis of the calculated SOCs of the battery cells, choose one battery cell among battery cells belonging to the selected target group as a target cell, calculate a balancing time according to a difference between the SOC of the standard cell and the SOC of the target cell, and perform balancing to the battery cells belonging to the target group during the calculated balancing time.

The control unit may be configured to select a battery cell having the calculated SOC out of a preset normal range from the SOC of the standard cell as the target group among the battery cells.

The control unit may be configured to select a battery cell having a minimum calculated SOC among the battery cells as the standard cell, choose a battery cell having a minimum SOC among the battery cells belonging to the selected target group as the target cell, and discharge the battery cells belonging to the target group during the calculated balancing time.

The control unit may be configured to select a battery cell having a maximum calculated SOC among the battery cells as the standard cell, choose a battery cell having a maximum SOC among the battery cells belonging to the selected target group as the target cell, and charge the battery cells belonging to the target group during the calculated balancing time.

After the balancing for the selected target group is firstly completed, the voltage measuring unit may be configured to measure a voltage of each battery cell belonging to the target group again and transmit the measured voltage to the control unit.

The apparatus for balancing a battery according to an aspect of the present disclosure may further comprise a storing unit configured to store the balancing time calculated by the control unit.

The control unit may be configured to perform balancing to the battery cells belonging to the target group while decreasing the balancing time stored in the storing unit.

The control unit may be configured to check whether the balancing is completed on the basis of the balancing time stored in the storing unit and send a voltage measurement signal to the voltage measuring unit when the balancing is completed.

The voltage measuring unit may be configured to measure a voltage of the battery cell when receiving the voltage measurement signal from the control unit.

A battery pack according to another aspect of the present disclosure may comprise the battery balancing apparatus according to an embodiment of the present disclosure.

An energy storage system according to still another aspect of the present disclosure may comprise the battery balancing apparatus according to an embodiment of the present disclosure.

A battery balancing method according to still another aspect of the present disclosure, which is performed in the apparatus for balancing a battery, may comprise: a SOC calculating step of calculating a SOC of each of a plurality of battery cells connected to each other; a standard cell selecting step of selecting a standard cell on the basis of the calculated SOCs of the battery cells; a target group selecting step of selecting a target group on the basis of the calculated SOCs of the battery cells and the SOC of the standard cell; a target cell choosing step of choosing one battery cell among the battery cells belonging to the target group as a target cell; a balancing time calculating step of calculating a balancing time according to a difference between the SOC of standard cell and the SOC of the target cell; and a battery cell balancing step of performing balancing to the battery cells belonging to the target group during the balancing time calculated in the balancing time calculating step.

The method for balancing a battery according to still another aspect of the present disclosure may further comprises, after the battery cell balancing step, a SOC recalculating step of recalculating a SOC of each of the battery cells belonging to the target group; and a repeating step of repeatedly performing the target group selecting step, the target cell choosing step, the balancing time calculating step and the battery cell balancing step on the basis of the SOCs of the battery cells recalculated in the SOC recalculating step.

The repeating step may be repeatedly performed until there is no battery cell belonging to the target group in the target group selecting step.

Advantageous Effects

According to an embodiment of the present disclosure, since battery cells belonging to a target group are balanced based on the balancing time calculated for each target group, the storage space required in the battery cell balancing process may be significantly reduced, thereby saving computing resources for managing a plurality of battery cells.

In addition, according to an embodiment of the present disclosure, as the amount of storage space is reduced, the design budget for the battery balancing apparatus and the battery pack including the same may be reduced, and the design may be simplified.

Further, according to an embodiment of the present disclosure, since the battery cells belonging to the target group are balanced during the calculated balancing time, overcharge or overdischarge of the battery cells may be prevented in advance.

The effects of the present disclosure are not limited to the above-mentioned effects, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is determined that a detailed description of a related known structure or function may obscure the subject matter of the present disclosure, the detailed description will be omitted.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
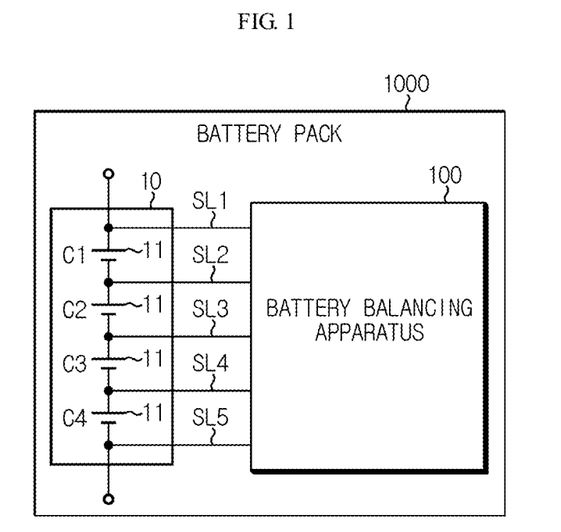
FIG. 1 is a diagram schematically showing a battery pack including a battery balancing apparatus according to an embodiment of the present disclosure.

FIG. 1 is a diagram schematically showing a battery pack including a battery balancing apparatus according to an embodiment of the present disclosure. FIG. 1 shows an example of a battery pack 1000 including one battery balancing apparatus 100 and one battery module 10. However, the number of battery modules 10 and battery balancing apparatuses 100 included in the battery pack 1000 according to the present disclosure is not limited to the number shown in FIG. 1, a plurality of battery balancing apparatuses 100 and a plurality of battery modules 10 may be included in the battery pack 1000. In addition, the battery balancing apparatus 100 may be connected to a plurality of battery modules 10 to perform balancing to each battery cell 11 included in the plurality of battery modules 10. Hereinafter, for convenience of description, it is assumed that the battery module 10 includes four battery cells 11.

Referring to FIG. 1, the battery balancing apparatus 100 according to the present disclosure may be connected to a battery module 10 including a plurality of battery cells 11 to perform balancing to each battery cell 11 included in the battery module 10. The detailed configuration of the battery balancing apparatus 100 will be described with reference to FIG. 2.

Figure 2:
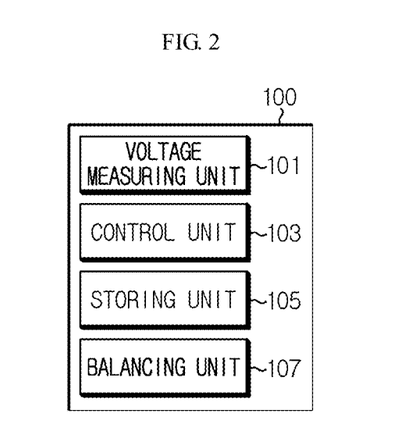
FIG. 2 is a block diagram schematically showing a configuration of the battery balancing apparatus according to an embodiment of the present disclosure.

FIG. 2 is a block diagram schematically showing a configuration of the battery balancing apparatus according to an embodiment of the present disclosure. Referring to FIG. 2, the battery balancing apparatus 100 may include a voltage measuring unit 101 and a control unit 103.

The voltage measuring unit 101 may measure a voltage of the battery cell 11 included in the battery pack 1000. Here, the plurality of battery cells 11 may be included in the battery pack 1000 in a state of being connected to each other. The voltage measuring unit 101 may measure a voltage of each of the plurality of battery cells 11 connected to each other. More specifically, the plurality of battery cells 11 may be included in the battery module 10 and connected to each other. The voltage measuring unit 101 is electrically connected to each battery cell 11 through a sensing line and may measure the voltage of each battery cell 11.

For example, as shown in FIG. 1, the battery balancing apparatus 100 may be electrically connected to battery cells C1, C2, C3 and C4 included in the battery module 10 through sensing lines SL1, SL2, SL3, SL4 and SL5. That is, the voltage measuring unit 101 may measure the voltage of each of the battery cells 11 included in the battery module 10, which are connected through the sensing lines SL1, SL2, SL3, SL4 and SL5. Specifically, the voltage measuring unit 101 may measure the voltage of the first battery cell C1 through the first sensing line SL1 and the second sensing line SL2 and measure the voltage of the second battery cell C2 through the second sensing line SL2 and the third sensing line SL3. In addition, the voltage measuring unit 101 may measure the voltage of the third battery cell C3 through the third sensing line SL3 and the fourth sensing line SL4 and measure the voltage of the fourth battery cell C4 through the fourth sensing line SL4 and the fifth sensing line SL5. The voltage measuring unit 101 may transmit the measured voltages of the battery cells C1, C2, C3 and C4 to the control unit 103.

The control unit 103 may calculate a state of charge (SOC) of each of the battery cells 11 from the voltage measured by the voltage measuring unit 101. That is, the control unit 103 may receive the measured voltage of each battery cell 11 from the voltage measuring unit 101 and calculate the SOC of each of the battery cells 11 on the basis of the received voltage of the battery cell 11.

For example, referring to FIG. 1, the control unit 103 may calculate the SOC of the first battery cell C1 from the measured voltage of the first battery cell C1 and calculate the SOC of the second battery cell C2 from the measured voltage of the second battery cell C2. In addition, the control unit 103 may calculate the SOC of the third battery cell C3 from the measured voltage of the third battery cell C3 and calculate the SOC of the fourth battery cell C4 from the measured voltage of the fourth battery cell C4.

The control unit 103 may select a standard cell and a target group on the basis of the calculated SOCs of the battery cells C1, C2, C3 and C4. The control unit 103 may select one battery cell among the battery cells belonging to the selected target group as the target cell and calculate a balancing time according to a difference between the SOC of the standard cell and the SOC of the target cell. The calculated balancing time may be stored in a predetermined storage device.

For example, the control unit 103 may select the first battery cell C1 among the battery cells C1, C2, C3 and C4 as the standard cell and select the second battery cell C2, the third battery cell C3 and the fourth battery cell C4 as the target group. The control unit 103 may select the second battery cell C2 among the battery cells C2, C3 and C4 included in the target group as the target cell and calculate a balancing time according to a difference between the SOC of the standard cell C1 and the SOC of the target cell C2. Here, the selection order of the standard cell, the target group and the target cell is only one example of the present disclosure, and the selection order of the standard cell, the target group and the target cell is just selected according to the arrangement order of the battery cells and is not limited thereto.

The control unit 103 may be configured to perform balancing to the battery cells belonging to the target group during the calculated balancing time. Specifically, the control unit 103 may be configured to perform balancing to all battery cells belonging to the target group during the calculated balancing time.

For example, in the above embodiment, the control unit 103 may be configured to collectively perform balancing to all battery cells C2, C3 and C4 belonging to the target group during the calculated balancing time. In this embodiment, if the balancing time calculated based on the difference between the SOC of the standard cell C1 and the SOC of the target cell C2 is 10 seconds, the control unit 103 may be configured such that the battery cells C2, C3 and C4 belonging to the target group are balanced for 10 seconds.

The battery balancing apparatus according to the present disclosure may further include a balancing unit 107, as shown in FIG. 2.

The balancing unit 107 may directly perform balancing to the battery cell 11 by control of the control unit 103. For example, the control unit 103 may transmit information of the battery cells 11 belonging to the target group, the calculated balancing time and a balancing execution signal to the balancing unit 107. Then, the balancing unit 107 may receive the information of the battery cell 11 belonging to the target group, the balancing time and the balancing execution signal from the control unit 103. In addition, the balancing unit 107 may be configured to charge or discharge the battery cells 11 belonging to the target group during the received balancing time.

Specifically, the control unit 103 may transmit the information of the battery cells C2, C3 and C4 belonging to the target group, the calculated balancing time (10 seconds) and the balancing execution signal to the balancing unit 107. The balancing unit 107 may receive the information of the battery cells C2, C3 and C4 belonging to the target group, the calculated balancing time (10 seconds) and the balancing execution signal, and balance the battery cells C2, C3 and C4 belonging to the target group for 10 seconds.

The balancing unit 107 may include a balancing path connected at both ends of each battery cell, and a resistor, a capacitor and/or a switch located on the balancing path in order to charge and/or discharge the battery cell. However, the present disclosure is not limited to the specific configuration of the balancing unit 107, and various balancing configurations known at the filing date of this application may be employed in the balancing unit 107 of the present disclosure.

According to the embodiment of the present disclosure, the battery balancing apparatus 100 may collectively balance the battery cells belonging to the target group during the balancing time calculated according to the difference between the SOC of the standard cell and the SOC of the target cell. That is, the battery balancing apparatus 100 according to an embodiment of the present disclosure does not store the balancing time for each battery cell 11 but stores the balancing time calculated for each target group, which saves memory resources for storing the balancing time calculated for each battery cell 11.

Further, a medium-sized large-sized battery pack used for an energy storage system (ESS) or an electric vehicle includes a large number of battery cells. At this time, in order to store a balancing time for each battery cell to balance the plurality of battery cells, too much storage space is required.

Accordingly, in order to meet the requirements of the memory amount and the calculation amount, a large number of memory units (RAMs, ROMs, registers, or the like) and calculating units (CPUs, GPUs, or the like) proportional to the number of battery cells are required. Therefore, in this case, the design of the battery pack used for an energy storage system (ESS) or an electric vehicle or the device for controlling the battery pack becomes complicated and its design cost increases. However, if the battery balancing apparatus 100 according to an embodiment of the present disclosure is applied, all the battery cells belonging to the target group are collectively balanced according to the balancing time stored for each target group, thereby significantly reducing the memory amount and the calculation amount required for balancing. Therefore, if the battery balancing apparatus 100 according to an embodiment of the present disclosure is applied, the requirements of the memory unit and the calculation unit required for the balancing of the battery cells are lowered, thereby simplifying the product design and drastically reducing the product design cost.

The difference in memory resources required when balancing the battery cells 11 by using the conventional battery balancing operation and the battery balancing apparatus 100 according to an embodiment of the present disclosure will be described as follows.

For example, it is assumed that 300 battery cells 11 are included in the battery pack 1000, and the 300 battery cells 11 are balanced by one battery balancing apparatus 100. In addition, it is assumed that the balancing time calculated by the control unit 103 has a size of 16 bits. According to the conventional battery balancing operation, the balancing time is calculated for each battery cell 11. In addition, since each battery cell 11 is independently balanced, a memory of 4800 bits (16 bits×300 cells) is demanded in total. However, according to an embodiment of the present disclosure, the balancing time is calculated according to the difference between the SOC of the standard cell and the SOC of the target cell. In addition, since all the battery cells 11 belonging to the target group are balanced during the calculated balancing time, a memory unit stores only the calculated balancing time, so a memory of 16 bits is demanded in total. In addition, according to an embodiment of the present disclosure, even if 16 bits are additionally required to calculate the balancing time in addition to the 16 bits for the calculated balancing time, a memory of just 32 bits is demanded in total.

That is, if the battery balancing apparatus 100 according to an embodiment of the present disclosure is used, the required memory amount may be decreased in proportion to the number of battery cells 11. Therefore, according to an embodiment of the present disclosure, only a certain memory amount is required regardless of the number of battery cells 11. Thus, even if the battery pack 1000 includes a large number of battery cells 11, demanded memory resources may be drastically reduced.

The control unit 103 may optionally include processors, application-specific integrated circuits (ASICs), other chipsets, logic circuits, registers, communication modems, data processing devices, and the like, known in the art to implement the various control logics described above. In addition, when the control logics are implemented in software, the control unit 103 may be implemented as a set of program modules. In this case, the program module may be stored in a memory and executed by a processor. The memory may be provided in or out of the processor and may be coupled to the processor through various means well known in the art.

Also, the memory may be included in the storing unit 105 of the present disclosure. In addition, the memory is a general term of a device in which information is stored regardless of the type of device, and does not refer to a specific memory device.

The control unit 103 may be a battery management system (BMS) that may be electrically coupled with a secondary battery or may be a control element included in the battery management system. The battery management system may refer to a system called BMS in the technical field of the present disclosure, but any system that performs at least one function described in this specification in a functional point of view may be included in the scope of the battery management system.

The control unit 103 may be configured to select, as the target group, a battery cell having the calculated SOC out of a preset normal range from the SOC of the standard cell, among the battery cells 11 included in the battery module 10 connected to the battery balancing apparatus 100. That is, the control unit 103 may select a standard cell among the battery cells 11 included in the battery module 10 first, and then select at least one battery cell 11 having an SOC out of the preset normal range from the SOC of the standard cell among the remaining battery cells 11 as the target group.

Here, the preset normal range may be set in consideration of hardware specification of the voltage measuring unit 101, the number of battery cells 11, or the type of the battery cells 11. For example, a voltage measuring IC chip included in the voltage measuring unit 101 may have different voltage measurement accuracies depending on its type. Therefore, the normal range may be set according to the hardware specification of the voltage measuring unit 101. In addition, the normal range may be set by various equations for the number of battery cells 11 and the balancing time so as to minimize a maximum balancing time required for balancing the battery cells 11 included in the battery pack 1000. In addition, the normal range may be set according to the type of battery cells 11 included in the battery pack 1000.

For example, in the embodiment of FIG. 1, the control unit 103 may select the first battery cell C1 as a standard cell among the first battery cell C1, the second battery cell C2, the third battery cell C3 and the fourth battery cell C4. The control unit 103 may check the preset normal range from the SOC of the first battery cell C1 and select a battery cell(s) having a SOC out of the normal range among the second battery cell C2, the third battery cell C3 and the fourth battery cell C4 as a target group. If the SOCs of the second battery cell C2 and the third battery cell C3 are out of the preset normal range from the SOC of the first battery cell C1, the second battery cell C2 and the third battery cell C3 may be included in the target group.

According to this configuration of the present disclosure, balancing is not always performed for all battery cells 11 included in battery module 10 but is performed only for battery cells having an SOC out of the preset normal range from the SOC of the standard cell. In this case, the number of battery cells requiring balancing may be reduced. Therefore, according to this aspect of the present disclosure, the total time required for balancing the battery modules 10 included in the battery pack 1000 is reduced, thereby quickly performing the balancing. In addition, according to an embodiment of the present disclosure, since balancing is performed only for the battery cells 11 belonging to the target group, the charging or discharging cycles of each battery cell 11 are not collectively increased, thereby preventing the life of the battery cells 11 from being shortened.

In a preferred embodiment according to the present disclosure, the control unit 103 may select a battery cell having a minimum calculated SOC as a standard cell among the plurality of battery cells 11.

For example, if the SOC of the first battery cell C1 shown in FIG. 1 is 10%, the SOC of the second battery cell C2 is 20%, the SOC of the third battery cell C3 is 30% and the SOC of the fourth battery cell C4 is 40%, the control unit 103 may select the first battery cell C1 having the smallest SOC as a standard cell.

After selecting the battery cell 11 having the minimum SOC as a standard cell, the control unit 103 may select a target group. In addition, the control unit 103 may select a battery cell 11 having a minimum SOC among the battery cells 11 belonging to the selected target group as the target cell. That is, the control unit 103 may select the battery cell 11 having the minimum SOC among the battery cells 11 included in the battery module 10 as a standard cell and select the battery cell 11 having the minimum SOC among the battery cells 11 belonging to the target group as a target cell.

For example, in the above embodiment, when the target group includes the second battery cell C2, the third battery cell C3 and the fourth battery cell C4, if the SOC of the second battery cell C2 is the smallest among the battery cells, the second battery cell C2 may be selected as the target cell.

The control unit 103 may be configured to discharge the battery cells 11 belonging to the target group during the balancing time calculated according to the difference between the SOC of the standard cell and the SOC of the target cell. That is, the control unit 103 may transmit the information of the battery cells 11 belonging to the target group, the calculated balancing time and the balancing execution signal to the balancing unit 107 to discharge the battery cells 11 belonging to the target group during the calculated balancing time.

For example, it is assumed that the balancing time required when the SOCs differ by 1% is 1 second. In addition, in the embodiment of FIG. 1, it is assumed that the SOCs of the first battery cell C1, the second battery cell C2, the third battery cell C3 and the fourth battery cell C4 are 10%, 20%, 30% and 40%, respectively. In addition, it is assumed that the standard cell is the first battery cell C1, the target group includes the second to fourth battery cells C2, C3 and C4, and the target cell is the second battery cell C2. Here, the control unit 103 may calculate the balancing time of 10 seconds from the difference between the SOC (10%) of the first battery cell C1 as the standard cell and the SOC (20%) of the second battery cell C2 as the target cell. In this case, the control unit 103 may be operated to discharge the second battery cell C2, the third battery cell C3 and the fourth battery cell C4 belonging to the target group during the calculated balancing time (10 seconds). After discharging, the SOC of the first battery cell C1 may be 10%, the SOC of the second battery cell C2 may be 10%, the SOC of the third battery cell C3 may be 20%, and the SOC of the fourth battery cell C4 may be 30%.

The battery balancing apparatus 100 according to an embodiment of the present disclosure may select and discharge only the battery cell 11 belonging to the target group among the battery cells 11 included in the battery module 10 during the calculated balancing time. For example, the battery cell 11 not belonging to the target group among the battery cells 11 included in the battery module 10 may not be discharged during the balancing time, unlike the battery cells 11 belonging to the target group.

Therefore, after repeated balancing is finally completed, the SOC of the battery cell 11 belonging to the target group is included in the preset normal range from the SOC of the standard cell, and thus the battery balancing apparatus 100 may prevent the battery cell 11 from being overdischarged by balancing.

In another preferred embodiment according to the present disclosure, the control unit 103 may select a battery cell having a maximum calculated SOC among the battery cells 11 as a standard cell.

For example, if the SOC of the first battery cell C1 shown in FIG. 1 is 80%, the SOC of the second battery cell C2 is 70%, the SOC of the third battery cell C3 is 60% and the SOC of the fourth battery cell C4 is 50%, the control unit 103 may select the first battery cell C1 having the maximum calculated SOC as a standard cell.

After selecting the battery cell 11 having the maximum SOC as the standard cell, the control unit 103 may choose a target group and select a battery cell 11 having a maximum SOC among the battery cells 11 belonging to the selected target group as a target cell. That is, the control unit 103 may select the battery cell 11 having the maximum SOC among the battery cells 11 included in the battery module 10 as the standard cell and choose the battery cell 11 having the maximum SOC among the battery cells 11 belonging to the target group as the target cell.

For example, in the above embodiment, when the target group includes the second battery cell C2, the third battery cell C3 and the fourth battery cell C4, if the SOC of the second battery cell C2 is greatest among the battery cells, the second battery cell C2 may be chosen as the target cell.

The control unit 103 may be configured to charge the battery cells 11 belonging to the target group during the balancing time calculated according to the difference between the SOC of the standard cell and the SOC of the target cell. For example, the control unit 103 may charge the battery cells 11 belonging to the target group during the calculated balancing time by transmitting the information of the battery cells 11 belonging to the target group, the calculated balancing time and the balancing execution signal to the balancing unit 107.

Similar to the above embodiment, it is assumed that the balancing time required when the SOCs differ by 1% is 1 second. In addition, in the embodiment of FIG. 1, it is assumed that the SOCs of the first battery cell C1, the second battery cell C2, the third battery cell C3 and the fourth battery cell C4 are 80%, 70%, 60% and 50%, respectively. In addition, it is assumed that the standard cell is the first battery cell C1, the target group includes the second to fourth battery cells C2, C3 and C4, and the target cell is the second battery cell C2.

In this case, the control unit 103 may calculate a balancing time of 10 seconds from the difference between the SOC (80%) of the first battery cell C1 as the standard cell and the SOC (70%) of the second battery cell C2 as the target cell. The control unit 103 may be operated to charge the second battery cell C2, the third battery cell C3 and the fourth battery cell C4 belonging to the target group during the calculated balancing time (10 seconds). After charging, the SOC of the first battery cell C1 may be 80%, the SOC of the second battery cell C2 may be 80%, the SOC of the third battery cell C3 may be 70%, and the SOC of the fourth battery cell C4 may be 60%.

The battery balancing apparatus 100 according to an embodiment of the present disclosure may select and charge only the battery cells 11 belonging to the target group among the battery cells 11 included in the battery module 10 during the calculated balancing time. For example, unlike the battery cells 11 belonging to the target group, the battery cell 11 not belonging to the target group among the battery cells 11 included in the battery module 10 may not be charged during the balancing time.

Therefore, after repeated balancing is finally completed, the SOCs of the battery cells 11 belonging to the target group are included in the preset normal range from the SOC of the standard cell, and thus the battery balancing apparatus 100 may prevent the battery cell 11 from being overcharged by balancing.

After the balancing for the target group is completed by the control unit 103 and the balancing unit 107, the voltage measuring unit 101 may measure a voltage of each of the battery cells 11 belonging to the target group again. In addition, the voltage measuring unit 101 may transmit the measured voltage to the control unit 103. The control unit 103 may receive the voltage of each battery cell 11 belonging to the target group from the voltage measuring unit 101. Thereafter, the control unit 103 may calculate the SOC of each of the battery cells 11 belonging to the target group again. The control unit 103 may change the battery cells 11 belonging to the target group by selecting a battery cell 11 having the calculated SOC out of the preset normal range from the SOC of the standard cell as a new target group. That is, after a first balancing for a first target group is completed, the voltage measuring unit 101 may measure a second voltage of the battery cell 11 belonging to the first target group to which the first balancing is completely performed. The control unit 103 may calculate a second SOC of the battery cell 11 belonging to the first target group from the second voltage of the battery cell 11 belonging to the first target group. The control unit 103 may select, as a second target group, a battery cell 11 having the calculated second SOC out of the preset normal range from the first SOC of the standard cell among the battery cells 11 belonging to the first target group. Like the first balancing, the control unit 103 may select a second target cell among the battery cells 11 belonging to the second target group and calculate a second balancing time according to a difference between the calculated second SOC of the second target cell and the first SOC of the standard cell. The control unit 103 may be configured to balance all of the battery cells 11 belonging to the second target group during the calculated second balancing time. The balancing process may be repeated until there is no battery cell 11 having a SOC out of the preset normal range from the first SOC of the standard cell.

For example, it is assumed that the first battery cell C1 shown in FIG. 1 is selected as the standard cell, and the second battery cell C2, the third battery cell C3 and the fourth battery cell C4 belong to the first target group. After the first balancing for the first target group is completed, the voltage measuring unit 101 may measure the second voltages of the second battery cell C2, the third battery cell C3 and the fourth battery cell C4 belonging to the first target group again, and transmit the measurement result to the control unit 103. The control unit 103 may calculate the second SOCs from the second voltages of the second battery cell C2, the third battery cell C3 and the fourth battery cell C4. If the second SOC of the second battery cell C2 is within the preset normal range from the first SOC of the first battery cell C1 as the standard cell but the second SOCs of the third battery cell C3 and the fourth battery cell C4 are out of the preset normal range from the first SOC of the first battery cell C1, the control unit 103 may select the third battery cell C3 and the fourth battery cell C4 as the second target group. If the third battery cell C3 is selected as the target cell in the second target group, the control unit 103 may be configured to calculate a second balancing time according to a difference between the first SOC of the first battery cell C1 as the standard cell and the second SOC of the third battery cell C3 as the target cell, and balance the third battery cell C3 and the fourth battery cell C4 belonging to the second target group during the calculated second balancing time. If a third SOC of the fourth battery cell C4 calculated after the second balancing is completed is out of the preset normal range from the first SOC of the first battery cell C1 as the standard cell, only the fourth battery cell C4 is selected as a third target group, and a third target balancing may be performed for the third target group.

After the first balancing is completed, the battery balancing apparatus 100 according to the present disclosure does not recalculate SOCs of all battery cells 11 included in the battery module 10 in order to check a balancing state of the battery cells 11 included in the battery module 10 but checks only SOCs of the battery cells 11 belonging to the first target group among the battery cells 11 included in the battery module 10. Thus, the SOC calculation may be performed quickly for additional balancing. That is, since the battery balancing apparatus 100 selects a second target group that needs additional balancing among the battery cells 11 belonging to the first target group, the second target group may be selected quickly, thereby minimizing the total balancing time for the battery module 10.

The battery balancing apparatus 100 according to the present disclosure may further include a storing unit 105, as shown in FIG. 2.

The storing unit 105 may store data or programs required for each component of the battery balancing apparatus 100 to perform an operation and function according to the present disclosure. For example, the storing unit 105 may store the balancing time calculated by the control unit 103. Specifically, the control unit 103 may calculate a balancing time according to the difference between the SOC of the target cell and the SOC of the standard cell and transmit the calculated balancing time to the storing unit 105. The storing unit 105 may receive the balancing time from the control unit 103 and store the received balancing time. Here, the storing unit 105 is not particularly limited as long as it is an information storage means known in the art to be able to write, erase, update and read data. As an example, the information storage means may include a RAM, a flash memory, a ROM, an EEPROM, a register, and the like. The storing unit 105 may store program codes in which processes executable by the control unit 103 are defined.

For example, if the first balancing time is calculated to be 10 seconds during the first balancing process, the control unit 103 may transmit a value for the calculated first balancing time (10 seconds) to the storing unit 105. The storing unit 105 may receive and store the value for the first balancing time (10 seconds) from the control unit 103.

The control unit 103 may be configured to perform balancing to the battery cells belonging to the target group while decreasing the balancing time stored in the storing unit 105. Specifically, the control unit 103 may check the time required for balancing the battery cells 11 belonging to the target group by decreasing the data about the balancing time stored in the storing unit 105.

For example, it is assumed that 10 in decimal number, or 1010 in binary, is stored in the storing unit 105 as the data for the balancing time. The control unit 103 may balance the battery cells 11 belonging to the target group through the balancing unit 107 while decreasing the data stored in the storing unit 105 by 1 every second. That is, if the balancing for the battery cells 11 belonging to the target group is completed, 0 may be stored in the storing unit 105 as data about the balancing time.

The battery balancing apparatus 100 according to an embodiment of the present disclosure may prevent redundant balancing for the battery cells 11 belonging to the target group by checking whether the stored balancing time remains while reducing the balancing time stored in the storing unit 105. Therefore, the battery balancing apparatus 100 may minimize the charge or discharge cycles of the battery cells 11 by preventing redundant balancing, thereby maintaining the life of the battery cell 11 for a long time. In addition, the battery balancing apparatus 100 may prevent unexpected error situations such as overcharging or overdischarging caused by redundant balancing.

The control unit 103 may check whether the balancing is completed on the basis of the balancing time stored in the storing unit 105. Here, the case where the balancing is completed may include a case in which the balancing time stored in the storing unit 105 is 0 or a case where data about the balancing time is deleted in the storing unit 105. That is, the control unit 103 may first check whether data about the balancing time is stored in the storing unit 105. If data about the balancing time is not stored in the storing unit 105, the control unit 103 may determine that the balancing to the battery cells 11 belonging to the target group is completed. On the contrary, if there is data about the balancing time stored in the storing unit 105, the control unit 103 may determine whether the balancing for the battery cells 11 belonging to the target group is completed by further checking whether the balancing time stored in the storing unit 105 is 0.

If the balancing is completed, the control unit 103 may transmit a voltage measurement signal to the voltage measuring unit 101. That is, if it is determined that the balancing is completed, the control unit 103 may transmit the voltage measurement signal to the voltage measuring unit 101 so that voltages of the battery cells 11 belonging to the target group are measured again. If the voltage measurement signal is received from the control unit 103 as described above, the voltage measuring unit 101 may measure the voltages of the battery cells 11 belonging to the target group again.

For example, if the first balancing time stored in the storing unit 105 is 0, the control unit 103 may determine that the first balancing process is completed. Thereafter, the control unit 103 may transmit the voltage measurement signal to the voltage measuring unit 101 to measure the voltages of the second battery cell C2, the third battery cell C3 and the fourth battery cell C4 belonging to the first target group again. The voltage measuring unit 101 may receive the voltage measurement signal from the control unit 103 and measure the second voltages of the second battery cell C2, the third battery cell C3 and the fourth battery cell C4 belonging to the first target group. The control unit 103 may calculate the second SOCs of the second battery cell C2, the third battery cell C3 and the fourth battery cell C4 belonging to the first target group from the second voltages measured by the voltage measuring unit 101. In addition, the control unit 103 may perform a second balancing process through the balancing unit 107 on the basis of the calculated second SOCs.

The battery balancing apparatus 100 according to an embodiment of the present disclosure may prevent redundant balancing to avoid overcharge or overdischarge problems in advance since the balancing is repeatedly performed while decreasing the battery cells 11 belonging to a target group. In addition, during the balancing process, since the balancing time is not calculated and stored for each battery cell 11 but is calculated and stored for each target group, it is possible to reduce the storage space required for storing the balancing time.

Figure 3:
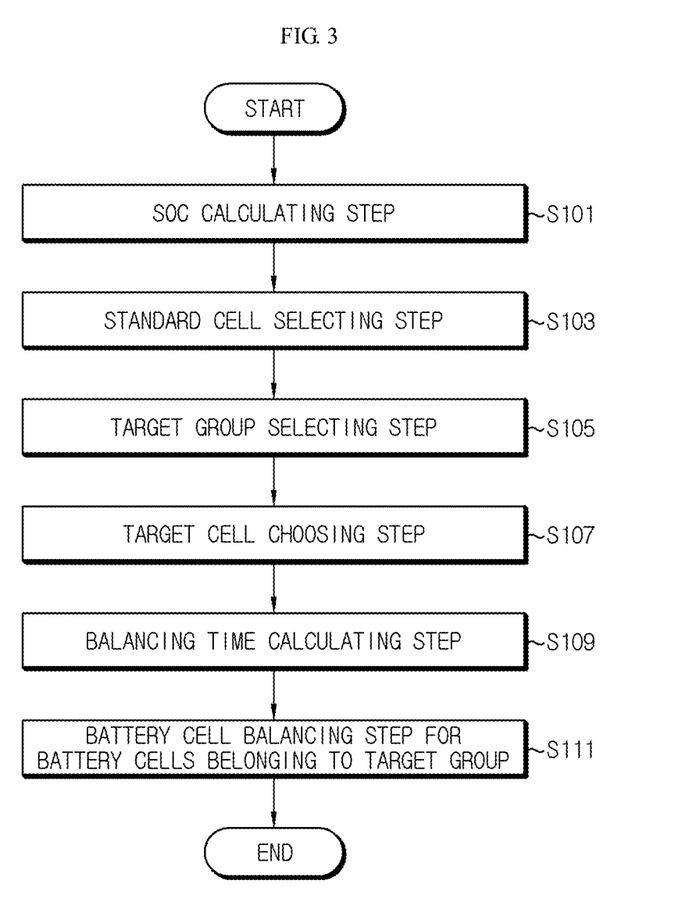
FIG. 3 is a flowchart schematically showing a battery balancing method according to an embodiment of the present disclosure.

FIG. 3 is a flowchart schematically showing a battery balancing method according to an embodiment of the present disclosure. A subject executing each step of FIG. 3 may be each component of the battery balancing apparatus 100 according to the present disclosure.

Referring to FIG. 3, the battery balancing method according to an embodiment of the present disclosure may include a SOC calculating step S101, a standard cell selecting step S103, a target group selecting step S105, a target cell choosing step S107, a balancing time calculating step S109 and a battery cell balancing step S111. Each step shown in FIG. 3 will be described with reference to FIG. 1.

In the SOC calculating step S101, a SOC of each of the battery cells 11 included in the battery module 10 connected to the battery balancing apparatus 100 may be calculated.

For example, in the embodiment of FIG. 1, the voltage measuring unit 101 may measure voltages of the first to fourth battery cells C1, C2, C3 and C4 through the sensing lines SL1, SL2, SL3, SL4 and SL5. The voltage measuring unit 101 may transmit the measured voltages of the first to fourth battery cells C1, C2, C3 and C4 to the control unit 103. The control unit 103 may receive the voltages of the first to fourth battery cells C1, C2, C3 and C4 from the voltage measuring unit 101 and calculate a first SOC of each of the first to fourth battery cells C1, C2, C3 and C4 on the basis of the received voltages.

In the standard cell selecting step S103, a specific cell may be selected as a standard cell among a plurality of battery cells included in the battery module. For example, the step S103 may be a step of selecting any one standard cell among the first to fourth battery cells C1, C2, C3 and C4 in the embodiment of FIG. 1. In particular, in the step S103, a battery cell having a minimum SOC or a battery cell having a maximum SOC may be selected as a standard cell. Hereinafter, an example when a battery cell having a minimum SOC is selected as a standard cell will be described.

More specifically, in the embodiment of FIG. 1, the control unit 103 may compare the SOCs of the first to fourth battery cells C1, C2, C3 and C4 and select a battery cell having a minimum first SOC as a standard cell. For example, if the first SOC of the first battery cell C1 is 40%, the first SOC of the second battery cell C2 is 80%, the first SOC of the third battery cell C3 is 60% and the first SOC of the fourth battery cell C4 is 50%, the control unit 103 may select the first battery cell C1 as the standard cell.

In the target group selecting step S105, a target group may be selected by grouping at least one battery cell among the battery cells included in the battery module, except for the standard cell. For example, the step S105 may be a step of selecting a battery cell having an SOC out of the preset normal range from the SOC of the standard cell among the battery cells 11 included in the battery module 10 connected to the battery balancing apparatus 100 as the target group.

For example, it is assumed that the preset normal range is 15%. In the above example, since the first SOCs of the second battery cell C2 and the third battery cell C3 are out of the preset normal range from the first SOC of the first battery cell C1 among the battery cells 11 included in the battery module 10, the control unit 103 may select the second battery cell C2 and the third battery cell C3 as the first target group.

In the target cell choosing step S107, a target cell serving as a reference for calculating a balancing time may be selected among the battery cells 11 belonging to the target group.

In particular, in the step S107, the control unit 103 may choose a battery cell 11 having the smallest first SOC among the battery cell s11 belonging to the first target group as the target cell. If the battery cell 11 having the greatest first SOC among the battery cells 11 included in the battery module 10 is selected as the standard cell, the control unit 103 may choose the battery cell 11 having the greatest first SOC among the battery cells 11 belonging to the first target group as the target cell.

In the above example, since the first SOC of the second battery cell C2 is 80% and the first SOC of the third battery cell C3 is 60%, the control unit 103 may select the third battery cell C3 among the battery cells belonging to the first target group as the target cell.

In the balancing time calculating step S109, a balancing time for the battery cells belonging to the target group may be calculated according to the difference between the SOC of the target cell and the SOC of the standard cell.

For example, it is assumed that the balancing time calculated when the SOCs differ by 1% is 1 second. In the above example, since the difference between the first SOC of the first battery cell C1 as the standard cell and the first SOC of the third battery cell C3 as the target cell is 20%, the control unit 103 may calculate the first balancing time as 20 seconds on the basis of the difference between the SOC of the standard cell and the SOC of the target cell.

In the battery cell balancing step S111, all of the battery cells belonging to the target group may be collectively balanced during the calculated balancing time.

In particular, in the step S111, the control unit 103 may store the calculated first balancing time in the storing unit 105. The control unit 103 may discharge the battery cells belonging to the first target group through the balancing unit 107 while decreasing the first balancing time stored in the storing unit 105.

In the above example, since the second battery cell C2 and the third battery cell C3 belong to the first target group, the control unit 103 may discharge the second battery cell C2 and the third battery cell C3 during the calculated first balancing time (20 seconds).

Figure 4:
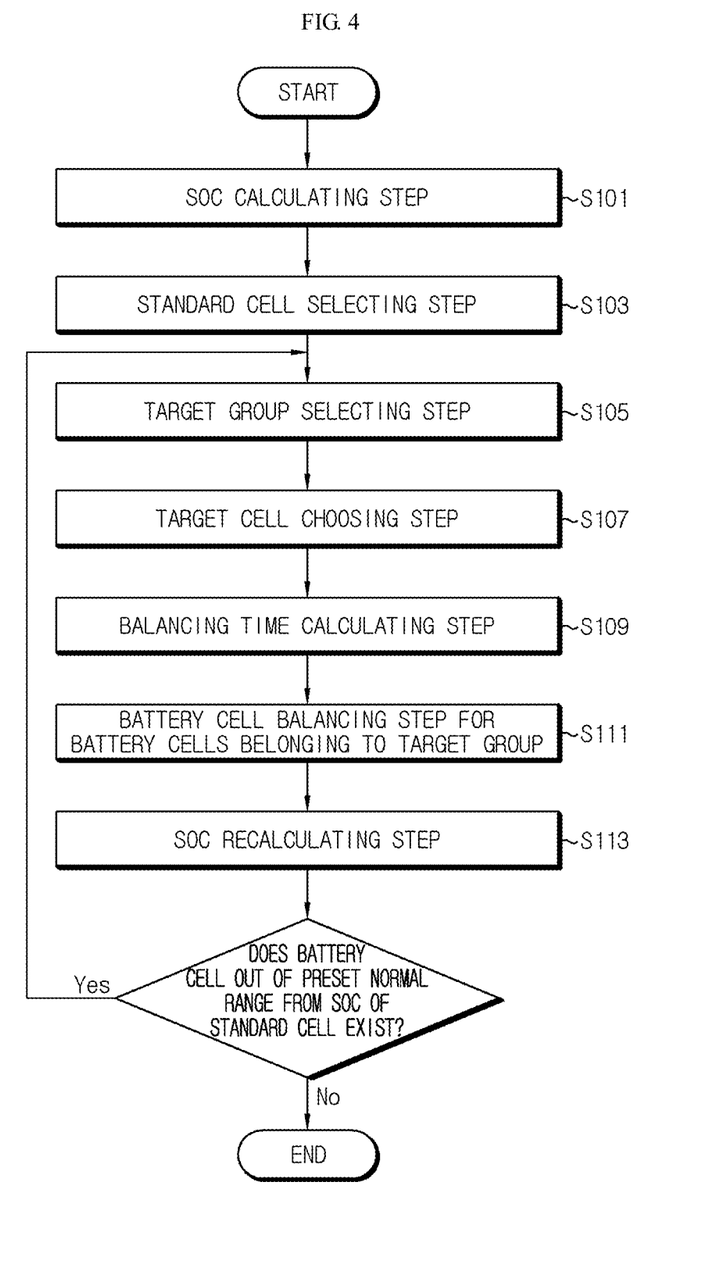
FIG. 4 is a flowchart schematically showing a battery balancing method according to another embodiment of the present disclosure.

FIG. 4 is a flowchart schematically showing a battery balancing method according to another embodiment of the present disclosure. Referring to FIG. 4, after the battery cell balancing step S111, an additional balancing operation may be performed. Hereinafter, different points from the embodiment of FIG. 3 will be described mainly.

Referring to FIG. 4, the battery balancing method according to an embodiment of the present disclosure may further include a SOC recalculating step S113 after the battery cell balancing step S111.

In the SOC recalculating step S113, SOCs of the battery cells 11 belonging to the target group may be recalculated in order to search for a battery cell 11 that requires additional balancing, after the first balancing for the battery cells 11 belonging to the first target group is completed.

For example, in the above example, after the first balancing for the second battery cell C2 and the third battery cell C3 is completed during the first balancing time (20 seconds), the voltage measuring unit 101 may measure second voltages of the second battery cell C2 and the third battery cell C3 belonging to the first target group and transmit the measured second voltages to the control unit 103.

The control unit 103 may receive the second voltages of the second battery cell C2 and the third battery cell C3 from the voltage measuring unit 101 and calculate a second SOC of each of the second battery cell C2 and the third battery cell C3 on the basis of the received second voltage.

For example, in the above example, the second SOC of the second battery cell C2 may be reduced by 20% from the first SOC to be calculated as 60%, and the second SOC of the third battery cell C3 may be reduced by 20% from the first SOC to be calculated as 40%.

After the SOC recalculating step S113, the control unit 103 may select, as a second target group, a battery cell(s) having the second SOC out of the preset normal range from the first SOC of the first battery cell C1 as the standard cell among the battery cells 11 included in the first target group.

For example, in the above example, the second SOC of the second battery cell C2 is 60% that is out of the preset normal range from the first SOC of the first battery cell C1 as the standard cell, but the second SOC of the third battery cell C3 is 40% that is identical to the first SOC of the first battery cell C1 as the standard cell. Therefore, the control unit 103 may select the second battery cell C2 as the second target group.

The battery balancing apparatus 100 may repeatedly perform the target cell choosing step S107, the balancing time calculating step S109, the battery cell balancing step S111 and the SOC recalculating step S113 for the second target group. That is, the battery balancing apparatus 100 may repeatedly perform balancing until SOCs of all battery cells 11 belonging to the first target group fall within the preset normal range from the SOC of the standard cell.

That is, the battery balancing apparatus 100 according to an embodiment of the present disclosure does not calculate and store a balancing time for each battery cell 11, but calculates and stores a balancing time in the unit of target group, thereby efficiently using the storage capacity of the storing unit 105 that stores the balancing time. Therefore, the battery balancing apparatus 100 may simplify the design of the battery balancing apparatus 100 and reduce the design cost by simplifying the required storage capacity.

Figure 5:
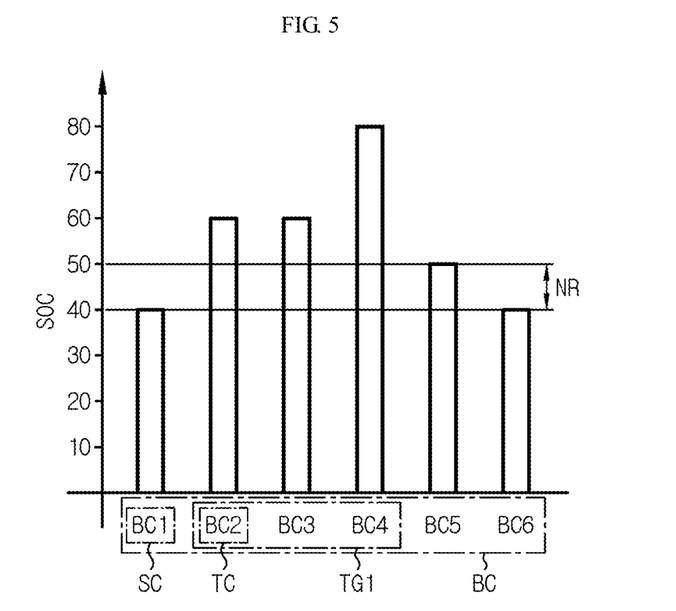
FIGS. 5 to 7 are diagrams showing the change of SOC of a battery cell balanced by the battery balancing apparatus according to an embodiment of the present disclosure.
Figure 6:
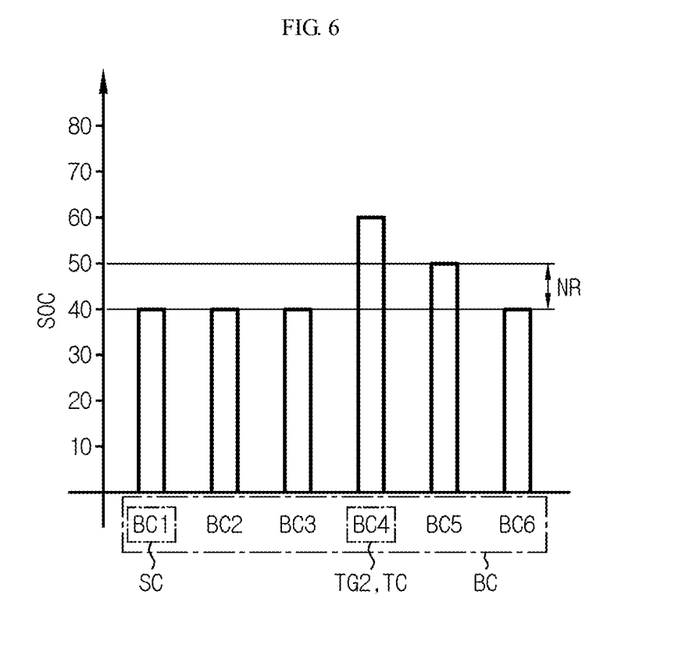
Figure 7:
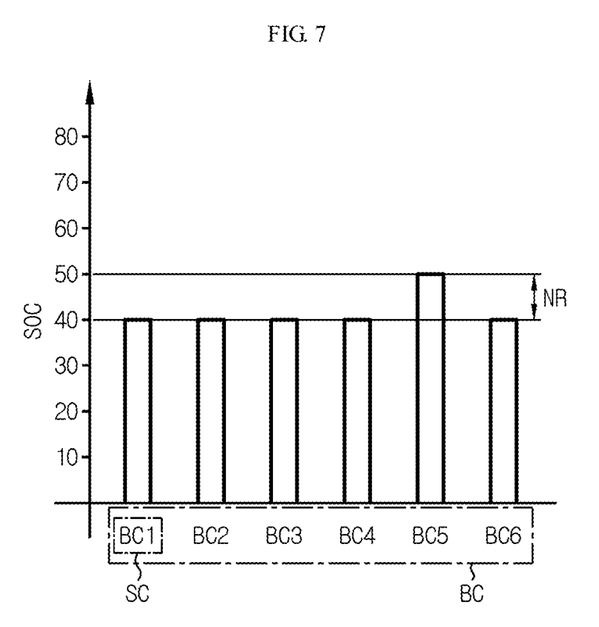

FIGS. 5 to 7 are diagrams showing the change of SOC of a battery cell balanced by the battery balancing apparatus according to an embodiment of the present disclosure. Hereinafter, an example of balancing battery cells while discharging the battery cells will be described with reference to FIGS. 5 to 7.

Referring to FIG. 5, it is assumed that battery cells BC includes a first battery cell BC1, a second battery cell BC2, a third battery cell BC3, a fourth battery cell BC4, a fifth battery cell BC5 and a sixth battery cell BC6, and the battery cells BC are balanced by one battery balancing apparatus 100. The first SOC of the first battery cell BC1 is 40%, the first SOC of the second battery cell BC2 is 60%, and the first SOC of the third battery cell BC3 is 60%. The first SOC of the fourth battery cell BC4 is 80%, the first SOC of the fifth battery cell BC5 is 50%, and the first SOC of the sixth battery cell BC6 is 40%. Also, it is assumed that the preset normal range NR is 10%.

The control unit 103 may select the first battery cell BC1 having the smallest first SOC among the battery cells BC as the standard cell SC. In the example of FIG. 5, the first SOCs of the first battery cell BC1 and the sixth battery cell BC6 are identically 40%, and thus it is assumed that the control unit 103 selects the first battery cell BC1 as the standard cell SC.

The control unit 103 may select a first target group TG1 by grouping the second battery cell BC2, the third battery cell BC3 and the fourth battery cell BC4 having the calculated first SOCs out of the preset normal range NR from the SOC of the standard cell SC.

The control unit 103 may select the second battery cell BC2 having the smallest first SOC among the battery cells BC2, BC3 and BC4 belonging to the first target group TG1 as a target cell TC. In the example of FIG. 5, since the first SOCs of the second battery cell BC2 and the third battery cell BC3 are identically 60%, it is assumed that the control unit 103 selects the second battery cell BC2 as the target cell TC.

Assuming that the balancing time takes 1 second when the SOCs differ by 1%, the control unit 103 may calculate a first balancing time (20 seconds) according to the difference (20%) between the first SOC of the standard cell SC and the first SOC of the target cell TC. In addition, the control unit 103 may control the balancing unit 107 to discharge the second battery cell BC2, the third battery cell BC3 and the fourth battery cell BC4 belonging to the first target group TG1 during the calculated first balancing time (20 seconds). That is, according to an embodiment of the present disclosure, the balancing is not performed to the fifth battery cell BC5 and the sixth battery cell BC6 not belonging to the first target group TG1, thereby preventing the battery cell BC from being overdischarged. In addition, since all battery cells belonging to the target group are discharged collectively during the calculated balancing time, a memory amount required to store the balancing time is significantly reduced compared to that of the conventional technology where a balancing time is calculated and stored for each battery cell.

The result of the first balancing is shown in FIG. 6. Referring to FIG. 6, after the first balancing is performed, the second SOC of the second battery cell BC2 belonging to the first target group TG1 is reduced to 40%, the second SOC of the third battery cell BC3 is reduced to 40%, and the second SOC of the fourth battery cell BC4 is reduced to 60%.

After the first balancing, the control unit 103 may calculate the second SOCs of the battery cells B2, BC3 and BC4 belonging to the first target group TG1. In addition, the control unit 103 may select a second target group TG2 to include the fourth battery cell BC4 having the second SOC out of the preset normal range NR from the first SOC of the standard cell SC among the battery cells B2, BC3 and BC4 belonging to the first target group TG1. In this case, since only the fourth battery cell BC4 is included in the second target group TG2, the fourth battery cell BC4 may be chosen as a target cell TC.

Similar to the first balancing process, the control unit 103 may calculate a second balancing time (20 seconds) by comparing the first SOC of the standard cell SC with the second SOC of the target cell TC. In addition, the control unit 103 may discharge the fourth battery cell BC4 belonging to the second target group TG2 during the second balancing time (20 seconds).

Referring to FIG. 7, after the second balancing is completed, the control unit 103 may calculate a third SOC of the battery cell BC. The change of SOC of the battery cell BC according to the first balancing and the second balancing are shown in Table 1.

TABLE 1

| | Initial (first SOC, %) | After first balancing (second SOC, %) | After second balancing (third SOC, %) |
|---|---|---|---|
| First battery cell BC1 | 40 | | |
| Second battery cell BC2 | 60 | 40 | |
| Third battery cell BC3 | 60 | 40 | |
| Fourth battery cell BC4 | 80 | 60 | 40 |
| Fifth battery cell BC5 | 50 | | |
| Sixth battery cell BC6 | 40 | | |

In Table 1, blank sections mean that the same value as a value on the left is applied since balancing is not performed. Since balancing is not performed to the first battery cell BC1, the fifth battery cell BC5 and the sixth battery cell BC6, the first SOC and the third SOC thereof may be the same. Since the first balancing is performed to the second battery cell BC2 and the third battery cell BC3, the second SOC and the third SOC thereof may be the same. Since the second balancing is performed to the fourth battery cell BC4, the third SOC thereof may be calculated as 40%.

As shown in FIG. 7 and Table 1, if there is no battery cell BC having a calculated third SOC out of the preset normal range NR from the first SOC of the standard cell SC, the control unit 103 may stop the balancing to the battery cell BC. That is, according to an embodiment of the present disclosure, if the SOC of the battery cell falls within a predetermined range from the SOC of the standard cell, the balancing is stopped, thereby preventing the battery cell from being overdischarged or overcharged.

A battery pack 1000 according to an embodiment of the present disclosure may include the battery balancing apparatus 100 according to the present disclosure. For example, as shown in FIG. 1, the battery pack 1000 may include the battery module 10 and the battery balancing apparatus 100. In addition, the battery pack 1000 according to the present disclosure may include, in addition to the battery balancing apparatus 100, electronic equipment (including a BMS, a relay, a fuse, and the like) and a pack case.

In addition, as another embodiment of the present disclosure, the battery balancing apparatus 100 may be mounted to various devices using electrical energy, such as an electric vehicle and an energy storage system (ESS). In particular, the battery balancing apparatus 100 according to the present disclosure may be included in the energy storage system. That is, the energy storage system according to the present disclosure may include the battery balancing apparatus 100 according to the present disclosure. Here, the battery balancing apparatus 100 may be included in the battery pack 1000 or may be implemented as a device separate from the battery pack 1000.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGN

10: battery module
11: battery cell
100: battery balancing apparatus
1000: battery pack

What is claimed is:

1. An apparatus for balancing a battery, comprising:
a voltage measuring unit including an integrated circuit and configured to measure a voltage of each of a plurality of battery cells connected to each other; and
a control unit including an integrated circuit and configured to:
calculate a state of charge (SOC) of each of the battery cells from the voltage measured by the voltage measuring unit;
select a standard cell and a target group based on the calculated SOCs of the battery cells, wherein the target group includes battery cells having the calculated SOC out of a preset normal range from the SOC of the standard cell;
choose, among the battery cells belonging to the target group, a battery cell having an SOC that is closest to the SOC of the standard cell as a target cell;
calculate a balancing time according to a difference between the SOC of the standard cell and the SOC of the target cell; and
perform balancing to all of the battery cells belonging to the target group during the calculated balancing time.

2. The apparatus for balancing a battery according to claim 1, wherein the control unit is further configured to:
select a battery cell having a minimum calculated SOC among the battery cells as the standard cell;
choose a battery cell having a minimum SOC among the battery cells belonging to the selected target group as the target cell; and
discharge the battery cells belonging to the target group during the calculated balancing time.

3. The apparatus for balancing a battery according to claim 1, wherein the control unit is further configured to:
select a battery cell having a maximum calculated SOC among the battery cells as the standard cell;
choose a battery cell having a maximum SOC among the battery cells belonging to the selected target group as the target cell; and
charge the battery cells belonging to the target group during the calculated balancing time.

4. The apparatus for balancing a battery according to claim 1, wherein the voltage measuring unit is further configured to, after the balancing for the selected target group is firstly completed:
measure a voltage of each battery cell belonging to the target group again; and
transmit the measured voltage to the control unit.

5. The apparatus for balancing a battery according to claim 1, further comprising:
a storing unit including a non-transitory computer-readable storage memory and configured to store the balancing time calculated by the control unit,
wherein the control unit is further configured to perform balancing to the battery cells belonging to the target group while decreasing the balancing time stored in the storing unit.

6. The apparatus for balancing a battery according to claim 5, wherein:
the control unit is further configured to:
check whether the balancing is completed based on the balancing time stored in the storing unit; and
send a voltage measurement signal to the voltage measuring unit when the balancing is completed; and
the voltage measuring unit is further configured to measure a voltage of the battery cell when receiving the voltage measurement signal from the control unit.

7. A battery pack, comprising the battery balancing apparatus according to claim 1.

8. An energy storage system, comprising the battery balancing apparatus according to claim 1.

9. A method for balancing a battery, which is performed in the apparatus for balancing a battery, the method comprising:
a SOC calculating step of calculating a SOC of each of a plurality of battery cells connected to each other;
a standard cell selecting step of selecting a standard cell based on the calculated SOCs of the battery cells;
a target group selecting step of selecting a target group based on the calculated SOCs of the battery cells and the SOC of the standard cell, wherein the target group includes battery cells having the calculated SOC out of a preset normal range from the SOC of the standard cell;
a target cell choosing step of choosing, among the battery cells belonging to the target group, a battery cell having an SOC that is closest to the SOC of the standard cell as a target cell;
a balancing time calculating step of calculating a balancing time according to a difference between the SOC of standard cell and the SOC of the target cell; and
a battery cell balancing step of performing balancing all of to the battery cells belonging to the target group during the balancing time calculated in the balancing time calculating step.

10. The method for balancing a battery according to claim 9, further comprising, after the battery cell balancing step:
an SOC recalculating step of recalculating an SOC of each of the battery cells belonging to the target group; and
a repeating step of repeatedly performing the target group selecting step, the target cell choosing step, the balancing time calculating step, and the battery cell balancing step based on the SOCs of the battery cells recalculated in the SOC recalculating step.

11. The method for balancing a battery according to claim 10, wherein the repeating step is repeatedly performed until there is no battery cell belonging to the target group in the target group selecting step.

* * * * *